United States Patent
Chon et al.

(10) Patent No.: US 7,600,906 B2
(45) Date of Patent: Oct. 13, 2009

(54) ILLUMINATION STRUCTURE COMPRISING A FLEXIBLE LIGHT GUIDE COUPLED WITH A LIGHT SOURCE

(75) Inventors: Yaw Yean Chon, Penang (MY); Ng Fook Chuin, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 146 days.

(21) Appl. No.: 11/384,754

(22) Filed: Mar. 20, 2006

(65) Prior Publication Data

US 2007/0217217 A1    Sep. 20, 2007

(51) Int. Cl.
F21V 7/04    (2006.01)
(52) U.S. Cl. .................. 362/555; 362/276; 362/552; 362/581
(58) Field of Classification Search .................. 362/276, 362/295, 551, 552, 554, 555, 556, 558, 581, 362/582, 800
See application file for complete search history.

(56) References Cited

U.S. PATENT DOCUMENTS

| 5,398,170 | A | * | 3/1995 | Lee | 362/582 |
| 5,465,194 | A | * | 11/1995 | Currie | 362/551 |
| 5,879,075 | A | * | 3/1999 | Conner et al. | 362/551 |
| 7,108,413 | B2 | * | 9/2006 | Kwong et al. | 362/295 |
| 2002/0122316 | A1 | | 9/2002 | Hsieh | |
| 2004/0066658 | A1 | | 4/2004 | Leung | |
| 2005/0200315 | A1 | | 9/2005 | Kwong | |
| 2005/0213343 | A1 | * | 9/2005 | Jablonski | 362/602 |
| 2008/0259631 | A1 | * | 10/2008 | Holder et al. | 362/554 |

FOREIGN PATENT DOCUMENTS

DE    8801805    3/1989
JP    360217317 A    * 10/1985

OTHER PUBLICATIONS

Circotech.com [online] Retrieved on Jan. 27, 2006 from http://www.circotech.com/serial-ata-ata150-cable-with-el-wire.html pp. 1-3.
Circotech.com [online] Retrieved on Jan. 27, 2006 from http:/www.circotech.com/sunbeam-night-magic-20-led-strip-light.html pp. 1-3.
Circotech.com [online] Retrieved on Jan. 27, 2006 from http://www.circotech.com/sunbeam-led-light-up-handles.html pp. 1-3.

* cited by examiner

Primary Examiner—Y My Quach Lee

(57) ABSTRACT

Embodiments of an illumination structure are provided. The illumination structure has a flexible light guide with an improved light coupling to a light source. According to one embodiment, the light source is mounted on a substrate, and the flexible light guide is optically coupled with the light source such that the light guide receives light output by the light source and emits at least a portion of the received light. A housing is also mounted on the substrate at least partially enclosing the light source and mechanically securing the flexible light guide in a desired alignment with the light source.

10 Claims, 3 Drawing Sheets

US 7,600,906 B2

ILLUMINATION STRUCTURE COMPRISING A FLEXIBLE LIGHT GUIDE COUPLED WITH A LIGHT SOURCE

TECHNICAL FIELD

The following description relates generally to illumination structures that emit light, and more particularly to illumination structures having a flexible light guide coupled with a light source.

BACKGROUND OF THE INVENTION

Various types of illumination structures are known. In general, as used herein, an illumination structure is a structure that emits light. Such illumination structures may be desired for various applications, from decorative lighting of a home or business (e.g., rope lights, etc.) to decorative lighting within small electronic devices, such as laptop computers or mobile telephones, etc. For a given application, a particular shape of the illumination structure may be desired. For instance, a shape that fits within a given electronic device may be desired. Further, it may be desirable for the illumination structure to emit light substantially evenly throughout. Many such applications in which lighting is provided primarily for aesthetic purposes are referred to as "fun light applications."

A traditional illumination structure that designers have used for creating light designs for applications has included a light guide and one or more light sources. The light source generates the light and the light output by such light source is carried through the light guide. The light guide emits at least a portion of the light that it carries (e.g., the light guide glows). Common light sources that are used with such a light guide are Light Emitting Diodes (LEDs). FIG. 1 shows an exemplary illumination structure used in prior designs. The exemplary illumination structure includes a light guide 120 and LEDs 110. Light guide 120 is a plastic part with microstructures underneath to extract light from LEDs 110, and thus light guide 120 is a rigid part. LEDs 110 are attached at various locations on light guide 120 as a source of light. Unfortunately, applications of this type of illumination structure have been limited. The rigidity and inflexibility of the light guide 120 results in difficulty for designers in creating certain fashionable shapes that may be desired for a given application. Also, the basic structure of the light guide 120 results in an uneven distribution of the brightness of the light emitted by the light guide because of hot spots near the light sources and because of light leakage at the bends or curves of light guide 120. Also, an undesirably large number of light sources (e.g., LEDs 110) may be required to compensate for the poor light coupling (which may be referred to as "optical coupling") of LEDs 110 to light guide 120 and light leakage from the curved portions of light guide 120.

Flexible light guides (which may be referred to as "light strips") provide an alternative to the above-mentioned rigid light guide 120. Flexible light guides are available for carrying light from one or more light sources and emitting at least a portion of such light along the length of the guides. Because of their flexibility, such flexible light guides afford greater versatility to designers in creating illumination structures for various applications. The flexible light guides provide a significant improvement over the above-mentioned rigid light guide 120 in the evenness and brightness of the light emitted throughout the entire length of the flexible light guide, as well as greater flexibility. An example of a known flexible light guide is one composed of an outer Teflon clad surrounding an inner elastomer core. Such a flexible light guide is able to bend with a curvature of ten millimeters in diameter while retaining more than 80% of its illuminance. FIG. 2 shows an example of such a flexible light guide 220 to which a light source (e.g., LED) 210 is coupled. A typical method of coupling flexible light guide 220 to LED 210 involves use of a heat-shrink tube 230. For instance, LED 210 and light guide 220 are positioned as desired relative to each other within a tube 230 that has a sufficiently large diameter to encompass LED 210 and light guide 220. Heat is then applied to tube 230 to shrink such tube 230 (e.g., reduce the tube's diameter), thereby causing the heat-shrink tube 230 to engage the light guide 220 and LED 210 to hold those components in place relative to each other. For this type of illumination structure, LED 210 is a through-hole type LED, and an end of flexible light guide 230 is placed in contact with LED 210 such that light generated by LED 210 is directed through light guide 230.

Unfortunately, the method of using heat-shrink tube 230 as a means of attaching flexible light guide 220 to LED 210 has several disadvantages that are undesirable for certain lighting applications. The use of heat-shrink tube 230 results in poor light coupling (or optical coupling) between the optical center of through-holed LED 210 and flexible light guide 220. The efficiency of the light coupling is further reduced because the heat-shrink tube 230 is not a good reflector, resulting in a loss of light through absorption by the heat-shrink tube 230. Because through-holed LEDs are required in this illumination structure (because of the use of the heat-shrink tube 230 to couple LED 220 to flexible light guide 220), application of this illumination structure to miniature products is limited. Moreover, the overall design using a heat-shrink tube 230 for coupling flexible light guide 220 with LED 210 has not proven to be a robust design, and can fail as a result of mechanical or thermal shock.

BRIEF SUMMARY OF THE INVENTION

In view of the above, a desire exists for an illumination structure that provides good light coupling (which may be referred to as "optical coupling") between a light source and a flexible light guide. A desire also exists for providing even distribution of brightness over the entire length of the light guide with minimal hotspots. A desire also exists for such an illumination structure that is robust with component coupling that minimizes failure from thermal or mechanical shocks. Still a further desire exists for such an illumination structure that is suitable for incorporation of chip-scale light sources and application within miniature devices, such as miniature electronics applications.

Embodiments of the present invention are directed to an illumination structure having a flexible light guide with an improved light coupling to a light source. Certain embodiments allow for curvature of the flexible light guide with minimal hot spots in the brightness of the light emitted thereby.

According to one embodiment, an apparatus comprises a substrate with a light source mounted thereon. The apparatus further comprises a flexible light guide that is optically coupled with the light source such that the light guide receives light output by the light source and emits at least a portion of the received light. The apparatus further comprises a housing mounted on the substrate such that the housing at least partially encloses the light source and mechanically secures the flexible light guide in a desired alignment with the light source.

In certain embodiments, the housing has a reflective interior, which optimizes the light coupling of the light source with the flexible light guide. In certain embodiments, the flexible light guide emits the received light along a length of the light guide. Advantageously, according to certain embodiments, the flexible light guide emits substantially an even distribution of the received light along a length of the light guide.

In certain embodiments, the housing comprises a hole for receiving an end of the flexible light guide. Thus, in one embodiment, by securing the end of the flexible light guide in the housing's hole, a coupling occurs between the light path of the flexible light guide and the optical center of the light source. In one embodiment, the inner surface of the hole has a textured surface, and the end of the flexible light guide is secured within the hole by an adhesive in contact with the textured surface. In certain embodiments, the adhesive is also in contact with the light source to secure the end of the flexible light guide to the light source within the housing. Preferably, the adhesive has a similar refractive index as the light guide.

In one embodiment, a recess in the outer surface of the housing terminates in close proximity to a portion of the inner surface of the hole. The recess may be of appropriate size to accommodate a punch tool such that a punch tool may be inserted into the recess, and with application of appropriate force, the punch tool may alter a portion of the inner surface of the housing's hole, thus creating a protrusion (e.g., sharp edge) protruding from the edge of the hole into the hole. Such protrusion may engage the flexible light guide inserted in the hole, thereby mechanically securing the flexible light guide within the hole. Such protrusion may be used in addition to or instead of the above-mentioned adhesive.

The light source may be any suitable light source desired for a given application, examples of which include a chip-scale light source, an LED (top-firing LED, side-firing LED, etc.), a tricolor light source, etc. Further, a plurality of light sources and/or a plurality of light guides may be included in certain embodiments. In certain embodiments, the light source comprises a tricolor light source, and the apparatus further comprises a color mixer connected the tricolor light source and operable to mix the light from the tricolor light source. The apparatus may further comprise a color feedback sensor providing a signal to a color controller, wherein the signal provides feedback as to changes in the color sensed at least one point on the flexible light guide. The apparatus may further comprise a current source driver receiving a control signal from the color controller in response to the feedback, such that the current source driver provides to the tricolor light source an appropriate current for maintaining a constant color and brightness in the flexible light guide.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 3:
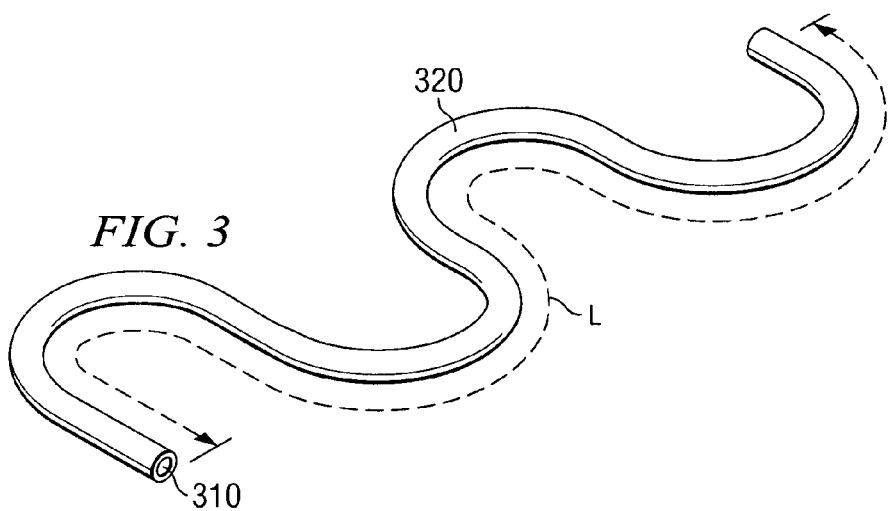
FIG. 3 shows an exemplary illumination structure according to one embodiment of the present invention, wherein a flexible light guide is coupled to a light source by molding the light source directly into the flexible light guide.
Figure 7A:
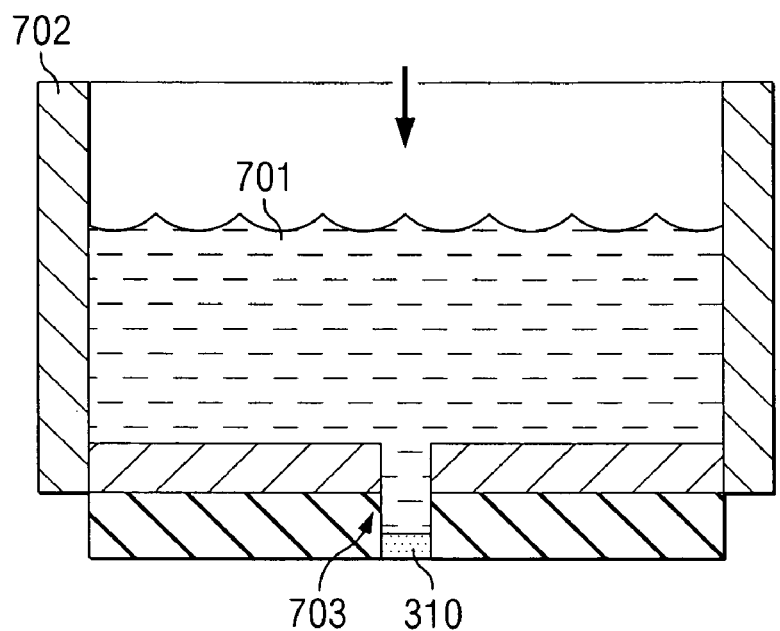
FIGS. 7A-7B show an exemplary process that may be used for molding a light source directly into a flexible light guide in accordance with certain embodiments of the present invention.
Figure 7B:
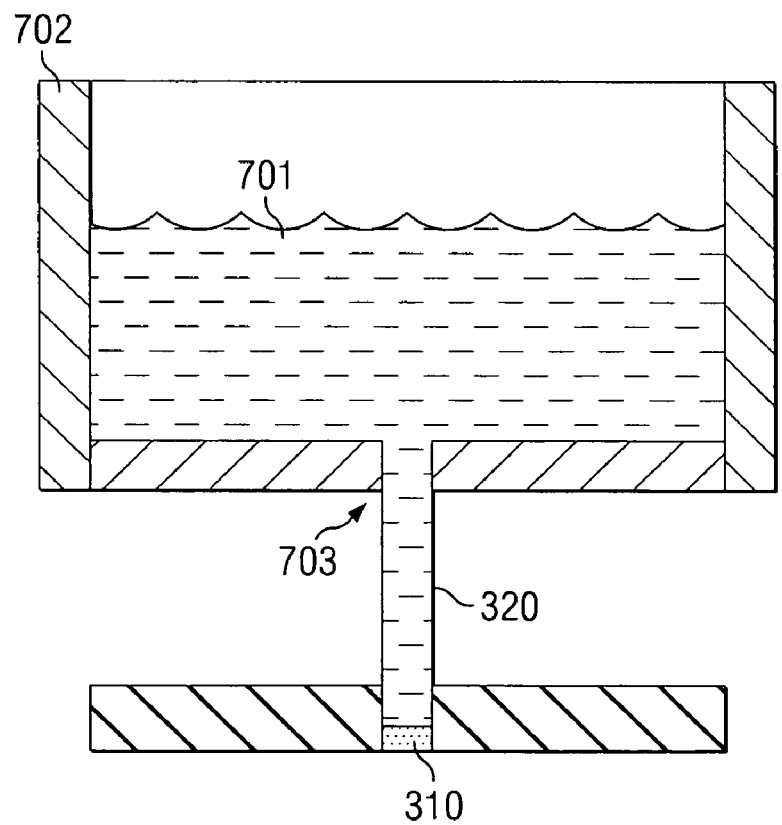

FIG. 3 shows an exemplary illumination structure according to one embodiment of the present invention. In this example, flexible light guide 320 is coupled to a light source 310 by molding light source 310 directly into flexible light guide 320. An exemplary process that may be used for molding light source 310 directly into flexible light guide 320 is shown in FIGS. 7A-7B. As shown in FIG. 7A, flexible material 701 (e.g., plastic) may be heated in a heating furnace 702 and pressure may be applied to force the heated (e.g., liquefied) material 701 through an aperture 703 to contact light source 310. As shown in FIG. 7B, a subsequent drawing process may be performed to form light guide 320. As the material 701 cools, it returns to a solid-state (e.g., solid plastic) that is flexible having light source 310 molded directly therein. In other embodiments, the light source 310 may be coupled within flexible light guide 320 in other suitable manner. The light source 310 can be either a top-firing or side-firing LED depending on the application for which the illumination structure is being used. Moreover, embodiments can use chip-scale surface mount LEDs for miniaturization of the illumination structure. Examples of such chip-scale surface mount LEDs that are commercially available include those LEDs commercially known as JLED manufactured by Avago Technologies and those LEDs commercially known as ChipLED also manufactured by Avago Technologies.

Figure 1:
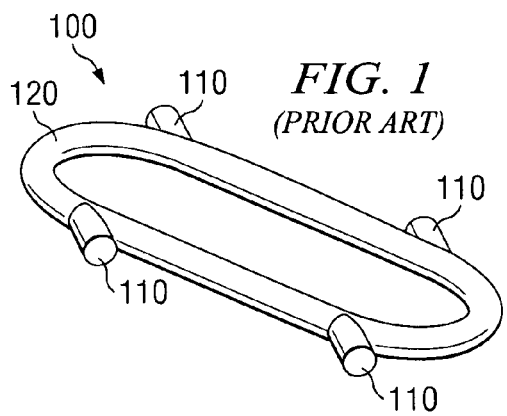
FIG. 1 shows an exemplary prior art illumination structure having a rigid light guide with multiple light sources.
Figure 2:
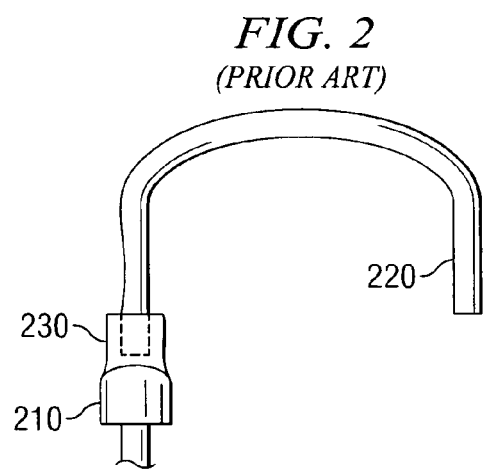
FIG. 2 shows another prior art illumination structure that comprises a flexible light guide coupled with a through-holed LED by a heat-shrink tube.

Flexible light guide 320 can be composed of any suitable material or materials. Flexible light guide 320 is flexible such that it is capable of being readily formed into a plurality of different shapes. Flexible light guide 320 carries light received thereby from light source 310. Further, at least a portion of flexible light guide 320 is of appropriate material for emitting at least a portion of the light from light source 310. In certain embodiments, flexible light guide 320 emits light from light source 310 throughout the light guide's length "L." In certain embodiments, flexible light guide 320 distributes the received light evenly throughout the length L, while at the same time allowing good flexibility. One such light guide 320 that may be used is light guide 220 described above with FIG. 2, which comprises an elastomer core surrounded by a Teflon clad. Such a flexible light guide 220 can bend around a curvature of ten millimeters and retain more than 80% of its initial illuminance. Use of such a flexible light guide, as described further herein, allows designers a great deal of versatility and freedom to create curves in their respective lighting applications, while having minimal hot spots.

While a single light source 310 is shown in the example of FIG. 3, in other embodiments a plurality of light sources 310 may be molded into light guide 320. For instance, a first light source 310 may be included for directing light along a first length "L1" of light guide 320, and a second light source 310 may be included for directing light along a second length "L2" of light guide 320. Such an implementation may allow for an illumination structure of greater length that maintains substantially even brightness of light emitted along its full length (e.g., L1+L2).

Figure 4:
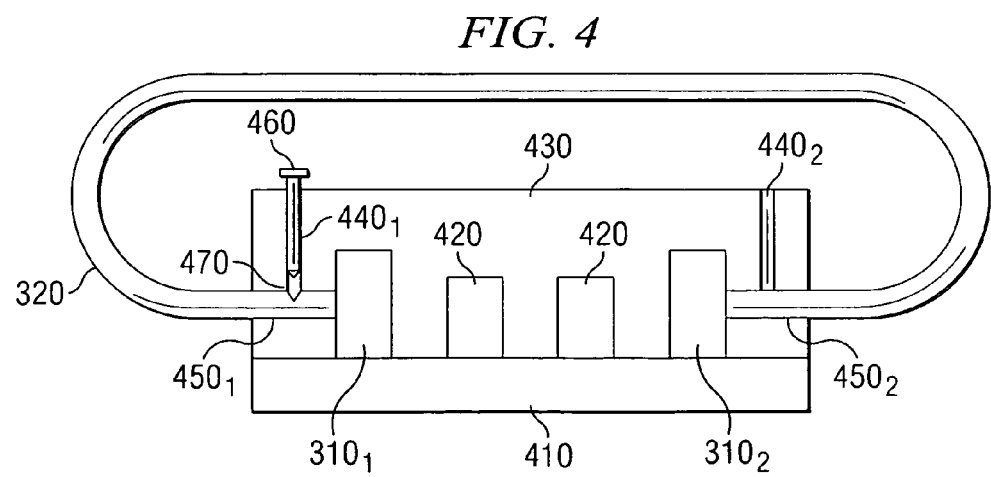
FIG. 4 shows an illumination structure according to another embodiment of the present invention, which comprises light sources mounted on a substrate and a housing enclosing the light sources and receiving (via a hole in the housing) ends of a flexible light guide to be optically coupled with the light sources.

FIG. 4 shows an illumination structure according to another embodiment of the present invention. In this example, the illumination structure comprises light sources $310_1$ and $310_2$ (collectively referred to as light sources 310) mounted on a substrate 410. In addition, various other components 420 of a given application may be included on substrate 410. For instance, substrate 410 may comprise a circuit board and components 420 may comprise various electrical components (e.g., integrated circuits, etc.) arranged thereon for forming at least a portion of a mobile telephone, laptop computer, computer mouse, personal digital assistant (PDA), automotive interior dashboard, or other electrical device in which the illumination structure is being employed. Substrate 410 may be a printed circuit board, flexible circuit, metal substrate, or any other suitable substrate depending upon the application. Substrate 410 can be connected to a power supply (that supplies an electrical current) by any conventional means, such as connectors, header pins, or a flexible circuit. Such a power supply and/or one or more of electrical components 420 may serve to drive light sources 310 and/or control the brightness and/or color of light sources 310. As described further herein, control circuitry may be included for controlling the brightness and/or color of light sources 310 in certain embodiments. The complexity of such control circuitry may vary depending on the application. For example, one embodiment comprises a few limiting resistors to limit the current applied to light sources 310, while another embodiment comprises a sophisticated integrated circuit with many electrical components (such as electrical components 420) for sensing and/or controlling the brightness and/or color of light sources 310.

As shown, flexible light guide 320 is also included. In this example, one end of flexible light guide 320 is optically coupled with light source $310_1$ and the opposite end of flexible light guide 320 is optically coupled with light source $310_2$. Flexible light guide 320 thus receives light output by the light sources 310 and emits at least a portion of the received light. In certain embodiments, flexible light guide 320 emits the received light along a length of the light guide 320. Advantageously, according to certain embodiments, the flexible light guide 320 emits substantially an even distribution of the received light along a length of the light guide 320.

The exemplary illumination structure of FIG. 4 further comprises a housing 430 mounted on substrate 410. In this example, housing 430 encloses light sources 310 therein. Further, housing 430 mechanically secures flexible light guide 320 in a desired alignment with light sources 310. For instance, in this example, housing 430 comprises holes $450_1$ and $450_2$ (collectively referred to as holes 450) into which opposing ends of flexible light guide 320 are inserted. That is, a first end of light guide 320 that is to receive light from light source $310_1$ is inserted into hole $450_1$, and the opposing end of light guide 320 that is to receive light from light source $310_2$ is inserted into hole $450_2$. Thus, in this embodiment, by securing the ends of the flexible light guide 320 in the housing's holes 450, a coupling occurs between the light path of the flexible light guide 320 and the optical center of the light sources 310. In one embodiment, the inner surface of the holes 450 is textured, and the ends of the flexible light guide 320 are secured within the respective holes into which they are inserted by an adhesive that is in contact with the hole's textured surface. In certain embodiments, the adhesive is also in contact with the light sources 310 to secure the ends of the flexible light guide 320 to the respective light source 310 from which it is to receive light. Preferably, the adhesive has a similar refractive index as the light guide. In certain embodiments, housing 430 has a reflective interior, which optimizes the light coupling of the light sources 310 with the ends of the flexible light guide 320.

In one embodiment, recesses $440_1$ and $440_2$ (collectively referred to as recesses 440) are included in the outer surface of housing 430. Recess $440_1$ terminates in close proximity to a portion of the inner surface hole $450_1$, and recess $440_2$ terminates in close proximity to a portion of the inner surface hole $450_2$. The recesses 440 are of appropriate size to accommodate a punch tool 460 such that the punch tool 460 may be inserted into the recesses 450, and with application of appropriate force, the punch tool 460 may alter a portion of the inner surface of the housing's holes 450, thus creating a protrusion (e.g., sharp edge) protruding from the edge of the hole into the hole. Such protrusion may engage the flexible light guide inserted in the hole, thereby mechanically securing the flexible light guide within the hole. An example of such a protrusion that may be formed in the interior of hole $450_1$ by tool 460 is shown in FIG. 4 as protrusion 470, which engages the portion of flexible light guide 320 that is inserted in hole $450_1$. Such protrusion may be used in addition to or instead of the above-mentioned adhesive. In certain embodiments, the protrusion may have a sharp edge or point that engages the flexible light guide 320.

While two light sources 310 are shown in the example of FIG. 4, any number of such light sources may be included in alternative embodiments. For instance, while both ends of flexible light guide 320 are optically coupled to a light source in the example of FIG. 4, in alternative embodiments only one of such ends may be so coupled. While a single housing 430 that encompasses both of the light sources 310 and optically couples (via holes 450) the ends of light guide 320 with their respective light sources 310 is shown in FIG. 4, in alternative embodiments separate housings may be used for each of the light sources 310. For instance, a first housing having hole $440_1$ may be included for encompassing light source $310_1$ and optically coupling such light source $310_1$ to a first end of flexible light guide 320, and a second housing having hole $440_2$ may be included for encompassing light source $310_2$ and optically coupling such light source $310_2$ to the opposite end of flexible light guide 320. Any such embodiments are intended to be within the scope of the present invention.

Figure 5:
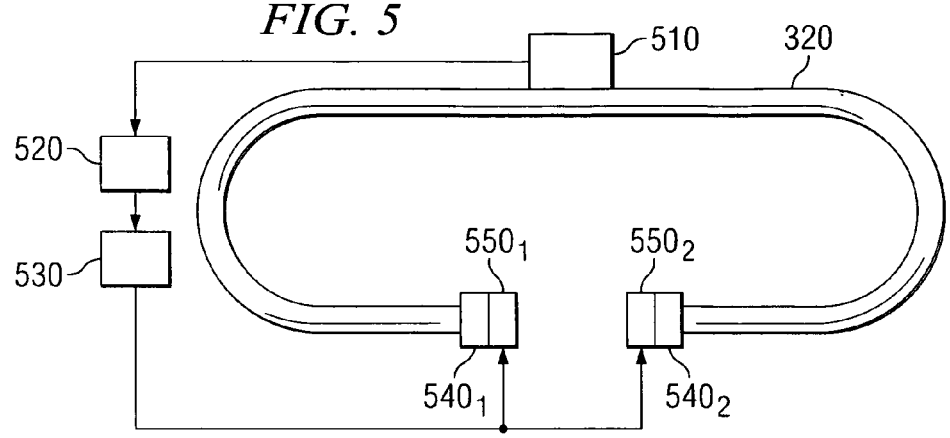
FIG. 5 shows an illumination structure according to another embodiment of the present invention, which includes tricolor light sources and a color management system.

FIG. 5 shows an illumination structure according to another embodiment of the present invention. The exemplary illumination structure of FIG. 5 includes tricolor light sources $550_1$ and $550_2$ (collectively referred to herein as tricolor light sources 550). A color management system is also included, which in this example includes a color feedback sensor and a color management integrated circuit (IC). The color management IC comprises a color controller 520 and a current source driver 530. Tricolor light sources 550 can each generate any color within the red, green, and blue locus of the CIE Chromaticity Diagram. Examples of known tricolor light sources that may be used include the light source commercially known as Right Angle Tricolor LED manufactured by Avago Technologies and the light source commercially known as Tricolor TLED also manufactured by Avago Technologies.

As in the example of FIG. 4, a flexible light guide 320 is coupled to the light sources 550. Specifically, in this example, a first end of light guide 320 is optically coupled to light source $550_1$ and the opposing end of light guide 320 is optically coupled to light source $550_2$. Color mixers $540_1$ and $540_2$ (collectively referred to as color mixers 540) can be placed in between the light sources 550 and the flexible light guide 320 as shown in FIG. 5. Thus, such color mixers 540 is a light guide used to mix the different colors of light emitted by the tricolor light source. The different colors of light produced by the tricolor light sources will travel in the light guide due to Total Internal Reflection (TIR). The repeated bouncing of different colors of light within the light guide will help homogenize the color before reaching the flexible light guide entrance aperture. As in the example of FIG. 4, the light sources 550 (and the color mixers 540) may be enclosed in housing(s), such as housing 430, which optically couple (via holes 450) the flexible light guide 320 with the light sources 550.

In the example of FIG. 5, a color sensor 510, positioned at a point where the three colors are well mixed, monitors the color (of the light emitted by light guide 320) at that point, and sends the appropriate feedback signals to color controller 520. Color controller 520 processes the feedback signal, and then sends the appropriate signal to the current source driver 530. Current source driver 530 then drives tricolor light sources 550 in such a manner as to maintain a constant color and brightness in flexible light guide 220. Such embodiment thus for a full choice of colors that can over time be maintained or controllably varied as may be desired for a given application. An example of a commercially known color controller that may be employed in this embodiment includes the controller commercially known as Jazz Color Controller manufactured by Avago Technologies. An example of a current source driver 530 that may be employed in this embodiment includes the driver commercially known as LED driver available from Microsemi. An example of a color sensor 510 that may be employed in this embodiment includes the color sensor commercially known as Solana Color Sensor available from Avago Technologies.

Figure 6A:
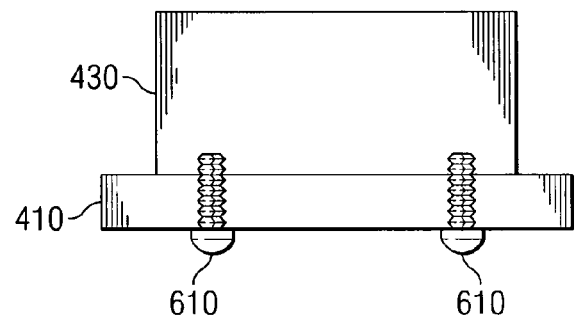
FIGS. 6A-6C show exemplary embodiments illustrating some of the different types of mechanical locks or fasteners that may be used for coupling a housing to a substrate.
Figure 6B:
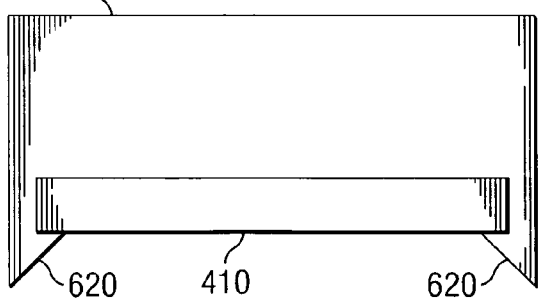
Figure 6C:
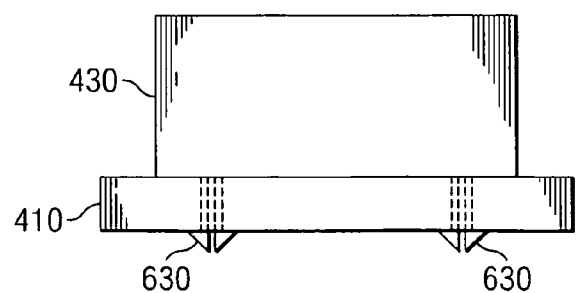

As mentioned above, in certain embodiments a housing 430 is mounted on a substrate 410 and encases light sources 310 (or tricolor light sources 550). In a preferred embodiment, housing 430 is made from a material having good reflectivity. That is, at least the interior of the housing preferably comprises a reflective material, such as ESR™ foil available from 3M, to optimize the optical coupling of the light generated by the enclosed light sources to the flexible light guide 320. Of course, in alternative embodiments housing 430 can be made from any material having desired strength for durable construction appropriate for a given application. Housing 430 can be attached to substrate 410 by the use of adhesives and/or mechanical locks or fasteners. The mechanical locks or fasteners can be any lock or fastener that securely attaches housing 430 to substrate 410 in order to create a durable design. FIGS. 6A-6C show exemplary embodiments illustrating some of the different types of mechanical locks or fasteners that may be used for coupling housing 430 to substrate 410. For example, in FIG. 6A housing 430 is attached to substrate 410 by means of a heat stick 610. In such a heat stick application, the stick may be implemented as part of the housing 430, whereby after applying heat and pressure, the stick forms a stud fastening both housing and substrate together. FIG. 6B shows housing 430 attached to substrate 410 by a lock mechanism 620, thus forming a sturdy unit. FIG. 6C shows another embodiment with snap locks 630 securely attaching housing 430 to substrate 410.

In one embodiment, when securely attached to substrate 410, housing 430 is positioned such that holes 450 align the optical center of a light source (e.g., light sources 310 or 550) with an end of flexible light guide 320 that is inserted through one of the holes 450. Thus, a good light coupling can be achieved between the light source and the flexible light guide. Flexible light guide 320 can be secured to housing 430 by an adhesive, mechanical locks, fasteners, and/or any other suitable means. The light coupling between the light source and the flexible light guide may be further enhanced by using an adhesive that has a refractive index similar to that of the flexible light guide to secure flexible light guide 320 in place. Such an adhesive increases the light coupling efficiency by reducing the Fresnel loss at the connection point, while securing the flexible light guide 320 in a hole 450 of housing 430. Adhesiveness can be further enhanced by texturing the inner surface of hole 450 such that it provides a better surface for the adhesive to grip once the adhesive and flexible light guide 320 have been inserted into hole 450.

In view of the above, certain embodiments of the present invention provide an improved illumination structure that comprises a flexible light guide with a good optical coupling to one or more light sources. Such illumination structure may be adapted for use in any of various different types of applications, including use within small-scale electronic devices, such as mobile telephones, etc. As described above, such optical coupling may be formed using a housing 430 that encloses the light source(s) and includes a hole through which an end of the flexible light guide 320 is inserted for optically coupling with the enclosed light sources. Certain embodiments thus enable aligning and attaching the flexible light guide to the optical center of the light source through the use of a housing 430. The housing also may provide a durable method of coupling the light guide to the light source after inserting the light guide through the hole in the housing and mechanically securing it. Embodiments also provide for color selection and control through the use of electrical components contained within the housing and mounted on the substrate, resulting in the maintenance of a constant color and brightness over time.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, said apparatus comprising:
   a substrate;
   a light source comprising at least one light emitting diode (LED) which is mounted on said substrate;
   a flexible light guide comprising a first end, a second end, and a medial portion between said first end and said second end, at least one section of said medial portion being able to emit light therefrom, said light guide being optically coupled with said light source such that said light guide receives light output by said light source and said section of said medial portion of said light guide emits at least a portion of said light received from said light source; and
   a housing mounted on said substrate such that said housing at least partially encloses said light source and mechanically secures said flexible light guide in a desired alignment with said light source;
   wherein said section of said medial portion of said flexible light guide comprises a length along which said light received from said light source is emitted, said light being emitted from said section of said medial portion in substantially an even distribution along said length;
   wherein said light source is a tricolor light source;
   said apparatus further comprising:
      a color mixer coupled to said tricolor light source and operable to mix the light output by said tricolor light source;
      a color feedback sensor providing a signal to a color controller, wherein said signal provides feedback indicating the color sensed at a point of light emitted by said flexible light guide; and
      a current source driver receiving a control signal from said color controller in response to said feedback, said current source driver managing current provided to said tricolor light source so as to maintain a constant color and brightness of said light emitted by said flexible light guide.

2. A method comprising:
   mounting a light source which comprises at least one light emitting diode (LED) on a substrate;
   at least partially enclosing said light source within a housing mounted on said substrate;
   providing a flexible light guide which comprises a first end, a second end, and a medial portion between said first end and said second end, at least one section of said medial portion being able to emit an even distribution of light therefrom; and
   optically coupling at least one of said first end and said second end of said flexible light guide to said light source through a hole in said housing such that said light guide receives light output by said light source and said section of said medial portion of said light guide emits at least a portion of said light received from said light source;
   securing said at least one of said first end and said second end of said flexible light guide in said hole;
   wherein said securing further comprises applying adhesive having a substantially same refractive index as said light guide.

3. A method comprising:
   mounting a light source which comprises at least one light emitting diode (LED) on a substrate;
   at least partially enclosing said light source within a housing mounted on said substrate;
   providing a flexible light guide which comprises a first end, a second end, and a medial portion between said first end and said second end, at least one section of said medial portion being able to emit an even distribution of light therefrom; and
   optically coupling at least one of said first end and said second end of said flexible light guide to said light source through a hole in said housing such that said light guide receives light output by said light source and said section of said medial portion of said light guide emits at least a portion of said light received from said light source;
   connecting a color mixer to said light source, wherein said light source is a tricolor light source;
   sensing color of light emitted by said flexible light guide; and
   providing feedback to a color controller that controls output of a current source driver to said tricolor light source.

4. An apparatus, said apparatus comprising:
   a substrate;
   a light source mounted on said substrate;
   a flexible light guide that is optically coupled with said light source such that said light guide receives light output by said light source and emits at least a portion of said light received from said light source; and
   a housing mounted on said substrate such that said housing at least partially encloses said light source and mechanically secures said flexible light guide in a desired alignment with said light source, said housing comprising a hole into which an end of said flexible light guide is inserted, said hole comprising an inner surface which is textured, said end of said flexible light guide being secured within said hole by an adhesive in contact with said surface, wherein said flexible light guide receives said light from said light source through said end.

5. The apparatus of claim 4 wherein said adhesive further couples said end to said light source.

6. The apparatus of claim 4 wherein said adhesive has a substantially same refractive index as said flexible light guide.

7. An apparatus, said apparatus comprising:
   a substrate;
   a light source mounted on said substrate;
   a flexible light guide that is optically coupled with said light source such that said light guide receives light output by said light source and emits at least a portion of said light received from said light source; and
   a housing mounted on said substrate such that said housing at least partially encloses said light source and mechanically secures said flexible light guide in a desired alignment with said light source, said housing comprising an outer surface and a hole into which an end of said flexible light guide is inserted, said outer surface comprising a recess that terminates in close proximity to a portion of said hole, a base of said recess being alterable by a punch tool inserted into said recess as to create a protrusion into said hole that engages said flexible light guide, wherein said flexible light guide receives said light from said light source through said end.

8. An apparatus, said apparatus comprising:
a substrate;
a tricolor light source mounted on said substrate;
a flexible light guide that is optically coupled with said tricolor light source such that said light guide receives light output by said tricolor light source and emits at least a portion of said light received from said tricolor light source;
a housing mounted on said substrate such that said housing at least partially encloses said tricolor light source and mechanically secures said flexible light guide in a desired alignment with said tricolor light source;
a color mixer coupled to said tricolor light source and operable to mix said light output by said tricolor light source;
a color feedback sensor providing a signal to a color controller, wherein said signal provides feedback indicating the color sensed at a point of light emitted by said flexible light guide; and
a current source driver receiving a control signal from said color controller in response to said feedback, said current source driver managing current provided to said tricolor light source so as to maintain a constant color and brightness of said light emitted by said flexible light guide, said color controller and said current source driver being located on said substrate and at least partially enclosed within said housing.

9. A method comprising:
mounting a light source on a substrate;
at least partially enclosing said light source within a housing mounted on said substrate;
optically coupling a flexible light guide to said light source through a hole in said housing; and
securing a portion of said flexible light guide in said hole, said securing comprising deforming an inner surface of said hole to create a protrusion that engages said flexible light guide such that said light guide receives light output by said light source and emits at least a portion of said light received from said light source.

10. The method of claim 9 wherein said deforming comprises using a punch tool to punch said protrusion into the inner surface of said hole.

* * * * *